United States Patent [19]

White, III et al.

[11] Patent Number: 4,962,309

[45] Date of Patent: Oct. 9, 1990

[54] MAGNETIC OPTICS ADAPTIVE TECHNIQUE

[75] Inventors: Frederic H. White, III, Poway; Patrick H. Hu, Thousand Oaks; Jerry R. Bettis, Simi Valley, all of Calif.

[73] Assignee: Rockwell International Corporation, El Segundo, Calif.

[21] Appl. No.: 396,192

[22] Filed: Aug. 21, 1989

[51] Int. Cl.$^5$ .............................................. H01J 3/00
[52] U.S. Cl. ........................ 250/396 R; 250/396 ML; 250/397
[58] Field of Search ........... 250/396 R, 396 ML, 397; 313/361.1

[56] References Cited

U.S. PATENT DOCUMENTS

| | | | |
|---|---|---|---|
| 2,547,994 | 4/1951 | Bertein | 250/397 |
| 2,991,361 | 7/1961 | Herrmann | 250/397 |
| 3,197,635 | 7/1965 | Dogsten et al. | 250/396 R |
| 3,571,590 | 3/1971 | Katagiri et al. | 250/397 |
| 3,753,034 | 8/1977 | Spicer | 315/31 R |
| 3,831,121 | 8/1974 | Oster | 335/210 |
| 3,952,198 | 4/1976 | Harada et al. | 250/396 ML |
| 4,214,162 | 7/1980 | Hoppe et al. | 250/396 ML |
| 4,355,236 | 10/1982 | Holsinger | 250/396 ML |
| 4,538,130 | 8/1985 | Gluckstern et al. | 335/306 |
| 4,556,823 | 12/1985 | Keller et al. | 250/356 R |
| 4,859,857 | 8/1989 | Stengl et al. | 250/396 ML |

Primary Examiner—Bruce C. Anderson
Attorney, Agent, or Firm—H. Fredrick Hamann; Harry B. Field; Steven E. Kahm

[57] ABSTRACT

This invention relates to a fine focusing lens for charged particle beams. Since the field lines of the poles are additive, and the lens 50 can be made to be very small, the lens can be used inside of a coarse focusing lens 51. The lens 50 employs a plurality of poles 1-32, evenly spaced, circumferentially around the lens. The poles may be wires 38 for electromagnetic poles or plates 35 for electrostatic poles. Each pole can be tagged to induce a frequency, pulse, or phase signal on the charged particle beam 49, so that the effects of each pole on the beam can be separately detected. The beam can therefore be focused by seeing the effects of and adjusting each pole separately. As the number of poles increases, the ability to finely focus a charged particle beam increases. The lens 50 as shown in the figures has 32 poles, which is enough to very finely focus a charged particle beam.

20 Claims, 3 Drawing Sheets

MAGNETIC OPTICS ADAPTIVE TECHNIQUE

FIELD OF THE INVENTION

This invention relates to finely focusing charged particle beams by electric and magnetic lenses.

BACKGROUND OF THE INVENTION

In devices which have charged particle beams or electron beams, such as electron microscopes, ion microscopes, free electron lasers, particle accelerators and other high energy heavy ion applications, there is a demand for lenses to focus the beams, with a high degree of accuracy, The use of dipoles, quadrupoles, sextupoles and higher order pole arrangements are common for deflecting the path of charged particle beams.

The poles employed in the prior art have a variety of shapes and sizes for varying the flux lines of the magnetic or electric fields.

Many devices use a series of lens along the beam path to try to focus the charged particle beams.

However conventional magnetic optics have not been practically demonstrated where sextupoles, octupoles or higher order poles have been used.

The poles used to deflect the charged particle beams may be electrostatic or magnetic.

Some devices use permanent magnets which may have distance adjusting means to move the magnet relative to the charged particle beam. Other devices use electromagnets with variable intensity capability. The electrostatic devices use charged plates to influence the charged particle beams.

In all the devices precision of alignment of the fields of force is critical. Most beams deflecting devices are large and have a relatively small number of poles.

Very fine adjustments for focusing charged particle beams with many closely spaced adjustable magnitude poles are not possible with the devices found in the prior art.

SUMMARY OF THE INVENTION

The present invention is directed to a very fine focusing of charged particle beams. It may be used in conjunction with a coarse focusing device to eliminate chromatic and geometric aberrations.

The invention uses a multiplicity of adjustable, field-strength poles circumferentially arranged around a charged particle beam.

The poles may be wires used to generate an electromagnetic field or plates for generating an electrostatic field.

As the number of poles increases, the ability to make fine adjustments to the charged particle beam increases.

Each pole may then be tagged to trace its influence on the charged particle beam by inducing an identifiable frequency, phase or pulse to the magnetic or electrostatic field which is picked up by the charged particle beam and detectable by a sensor at the focal point.

Each pole may be separately adjusted and its influence on the charged particle beam observed until the beam is satisfactorily focused.

Since the effect of each pole on the charged particle beam is linearly additive, it is easy to calculate the fields needed to steer the beam for the desired result.

DETAILED DESCRIPTION OF THE PREFERRED EMBODIMENT

Figure 1:
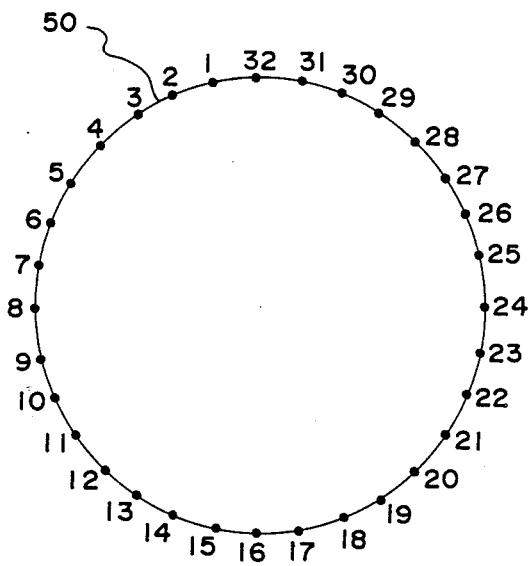
FIG. 1 is a top view of the multipole electromagnet showing 32 poles.

FIG. 1 shows a schematic end view of the invention with 32 poles. Although 32 poles are shown in the drawings, any number of poles will work. Increasing the number of poles increases the ability of the lens to focus the charged particle beam more accurately. Preferably at least 16 poles are used. The upper limit of the number of poles employed is how many poles will fit in the space on the circumference of the lens.

The poles in the lens may be magnetic or electrostatic.

Figure 5:
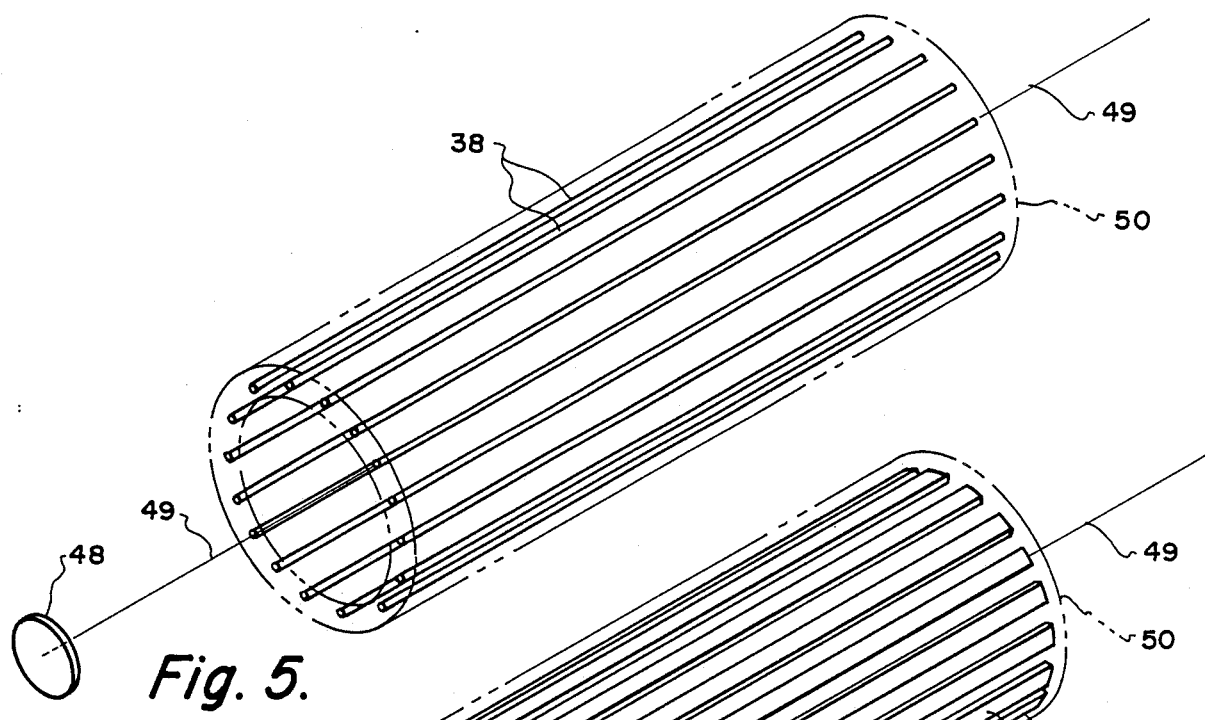
FIG. 5 shows a side perspective view of a magnetic lens showing how the wires are aligned.
Figure 6:
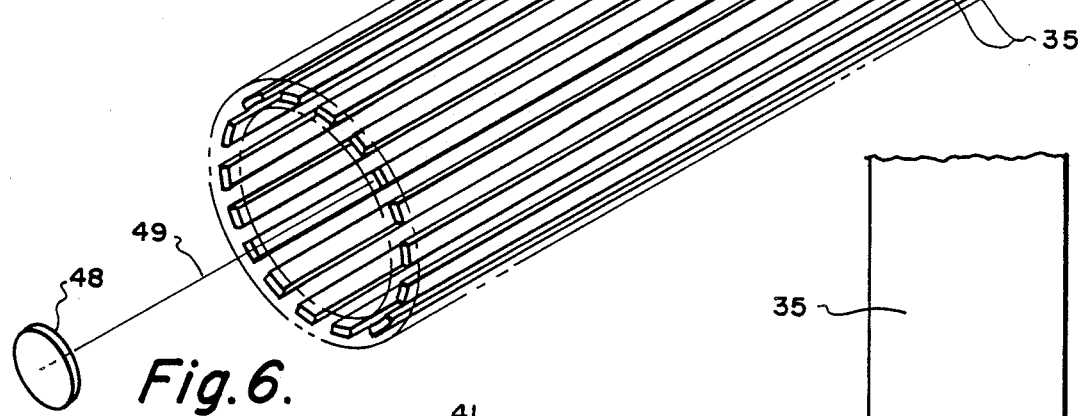
FIG. 6 is a side perspective view of an electric lens showing how the plates are aligned.
Figure 7:
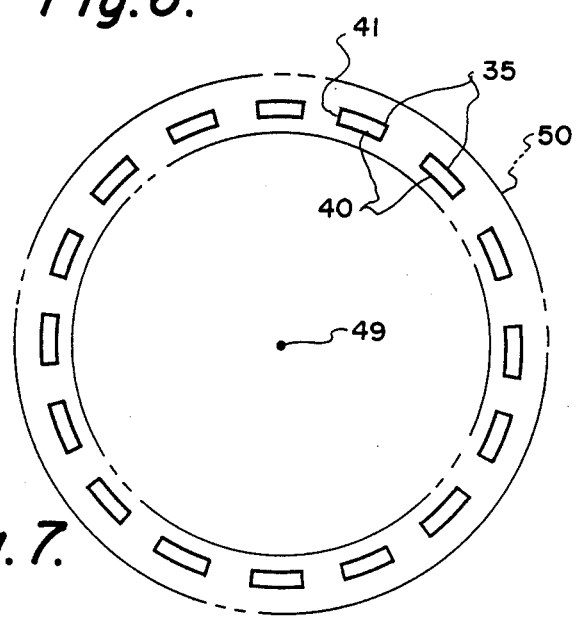
FIG. 7 is an end view of the plates on the lens case.
Figure 8:
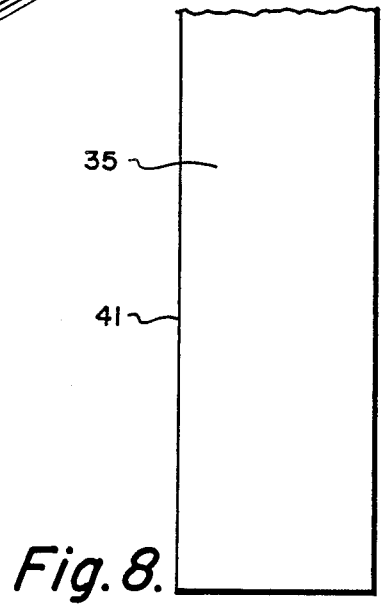
FIG. 8 is a front view of a plate used in the electrostatic lens.
Figure 9:
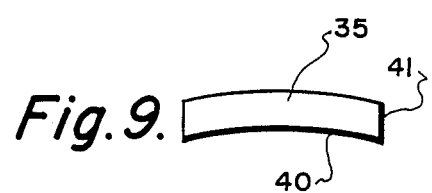
FIG. 9 is a top view of a plate used in the electrostatic lens.

For the magnetic field case (see FIG. 5), it is preferred to use a thin wire or strands of wire 38 for each pole and pass a current therethrough for generating a magnetic field. There is a means to control the current in each wire separately so the lens may be adjusted to make small changes in the charged particle beam. Preferably two to three amps of direct current will pass through each wire. The controls preferably are sensitive enough to vary the current by one milliamp increments for fine tuning the charged particle beam. To tag the pole an alternating current of about one milliamp with a frequency of between 100 kilohertz and one megahertz in five kilohertz increments can be superimposed on the current in the wire to tag the effect of that pole on the charged particle beam 49. A sensor 48 at the focal point can detect the frequency imposed by each pole and adjustment of each pole can therefore be made until the charged particle beam 49 is satisfactorily focused.

It is also possible to tag the pole by using pulses or phases changes which are capable of being detected by the sensor 48.

As used herein a charged particle beam includes an electron beam.

For the electrostatic field case (see FIGS. 6, 7, 8 and 9), it is preferred to use a plurality of curved plates 35 for the poles. The curve in the plate is a section of the circumference of the lens. There is a means to control the charge on each plate separately. The charge on each plate can preferably be varied between one-thousand electron volts and one million electron volts. To tag the poles each plate can have its potential varied sinusoidally between one kilohertz and one megahertz with an amplitude of 0.1 microvolts. A sensor 48 at the focal point can detect the frequency imposed by each pole in five kilohertz increments and adjustments of each pole can therefore be made until the beam is satisfactorily focused. It is also possible to tag the pole by using pulses or phase changes which are capable of being detected by the sensor 48.

All the poles should be equidistant from the center of the lens. The alignment of the pole's field lines relative to the charged particle beam is extremely important. In the magnetic field case the wires 38 must be parallel to the axis of the lens and fixed so they will not be able to move. The spacing between the wires on the circumference of the lens is also critical to the accuracy of the lens. When the 32 poles are used, the center of each of the poles should be placed 11.25 degrees apart, around the circumference of the lens. It is preferred to use a lens with a diameter of approximately two inches.

For the electrostatic case the plates 35 must be aligned so that the curved surface of the plates 40 are on the circumference of the lens 50. The edges 41 of the plates must be parallel to the axis of the lens.

The surface 40 of the plates 35 must be smooth and curved precisely so the electric field is as near perfect as possible. Otherwise there will be errors introduced to the charged particle beam 49 due to the poor distribution of the field lines.

The length of the field is important in the focusing of the beam. The longer the ion is in the field the more effect the field will have on the ion. Further, in any electric or magnetic field the field lines can be made fairly uniform for most of the length of the field but will be different at the ends of the fields. It is important to have a length of uniform field lines long enough to influence the ions in a known way to focus the charged particle beam. Therefore, it is preferred to have a uniform field in each pole of on the order of two to ten inches long. It is also preferred to have the ratio of pole length to lens diameter on the order of 4 to 1.

The fringe effects at the ends of the lens may be ignored since the pole's field lines are long compared to the fringe's field lines.

By using a variable potential surface for the electric field case or a variable current distribution for the magnetic field case, a two-dimensional electric or magnetic field with a prescribed spacial distribution for focusing a charged particle beam can be generated.

The lens with its variable elements can then readily correct geometric and chromatic aberrations and correct steering errors.

Figure 12:
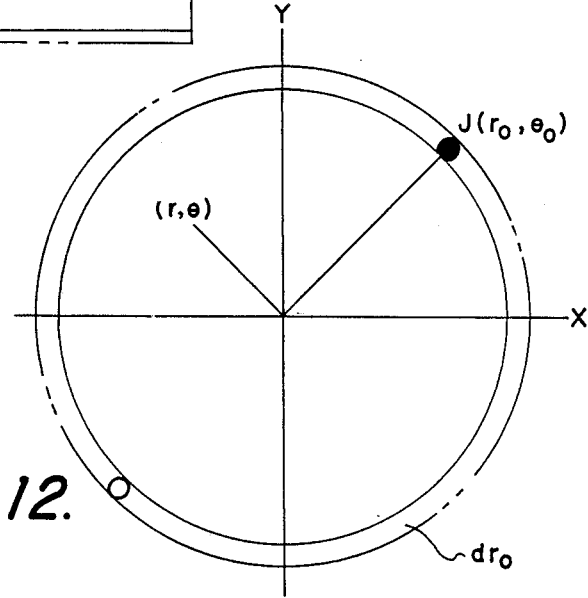
FIG. 12 is a diagram of a two axis cross section of the field of the charged particle beam.

For the magnetic field case, it can be shown that for a current distribution on the x-y plane, as shown in FIG. 12, the vector potential is given by $\overline{A}=(O, O, A_z)$. The magnetic field is given by $\overline{B}=\nabla\times\overline{A}$. In MKS units $$A_z = \tfrac{1}{4} J(r_o,\theta_o) \, r_o dr_o d\theta_o \times$$

$$\left\{ \ln r_o + \sum_{n=1}^{\infty} \frac{1}{n} \left(\frac{r}{r_o}\right)^n \cos n(\theta - \theta_o) \right\}$$

where $r_o\theta_o$ and $r\theta$ are in cylindrical coordinates and refer to the current element and point of observation respectively. $J(r_0, \theta_0)$ is the current per unit area going into the paper as shown with the colored-in circle or out of the paper as shown with the open circle (see FIG. 12). Each term in the infinite series expansion represents the field of the multipole component of the magnetic field.

In the special case where the current is distributed over a ring of radius a, and thickness da, $I(\theta) \equiv J(r, \theta) \, a \, da$ Therefore, $$I(\theta_o) = I_o \sum_{m=0}^{\infty} A_m \cos m(\theta_o - \theta_m),$$

which is the decomposition of the current into its Fourier components. Substituting this result for $J(r, \theta)$ term above and integrating from 0 to $2\pi$ results in $$A_z(r,\theta) = \frac{I_o}{8} \sum_{n=1}^{\infty} \frac{A_n}{n} \left(\frac{r}{r_o}\right)^n \cos n(\theta - \theta_n)$$

with the constant term deleted.

This means that given a current with nth Fourier component of amplitude $A_n$ and phase angle $\theta_n$ results in the nth magnetic multipole with phase angle $\theta_n$.

The results are linear and superposition is therefore possible.

For example: To calculate the current needed for a magnetic field with values $I_o/8$ ($a_1, a_2, a_3, a_4, a_5$) $\theta_1, \theta_2, \theta_3, \theta_4, \theta_5$. The current distribution is given by $$I(\theta) = I_o \sum_{n=1}^{5} A_n \cos n(\theta - \theta_n)$$

In practice you have to use discrete elements on the order of 32 or more elements to approximate the above equation.

With each variable element identified the magnetic optics adaptive technique as outlined above can be applied to focus a charged particle beam.

Each pole has its current varied about a nominal value at a distinct frequency, phase or pulse.

For example: A direct current of tens of amps may be applied with a 100 kilohertz current of tenths of amps in one of the poles.

Depending on the use of the lens different values will be required at the poles.

The variations of a suitable merit function is observed at each signature frequency, phase or pulse and a new set point is assigned to each variable element so as to optimize the merit function. This procedure continues in a closed-loop control system until no further optimization is possible. For different applications different optimum geometry configurations for the current elements can be designed.

For the electric field case the equations are completely identical with the magnetic field case.

The potential $\Phi$ is substituted for the vector potential $A_z$ and the current is replaced by the voltage applied to the cylinder.

Therefore $$\Phi = A \ln \frac{1}{r_o} + \sum_{n=1}^{\infty} \left(\frac{r}{r_o}\right)^n A_n \cos n(\theta - \theta_n)$$

where Φ is completely defined by boundary considerations.

Figure 2:
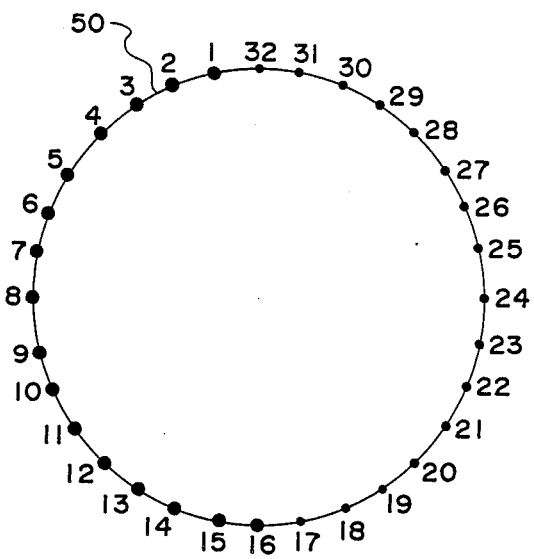
FIG. 2 is a top view of the multipole used as a quadrupole.

FIG. 2 shows the invention being used as a quadrupole. In this embodiment poles 1-8 and 9-16 (shown with the heavy dots) are the positive poles in the quadrupole. Poles 17-24 and 24-32 are used as the negative poles in the quadrupole.

Since each pole can be individually controlled for current in the case of a magnetic lens or for charge in the case of an electrostatic lens a large combination of fields is available for fine tuning a charged particle beam.

Figure 3:
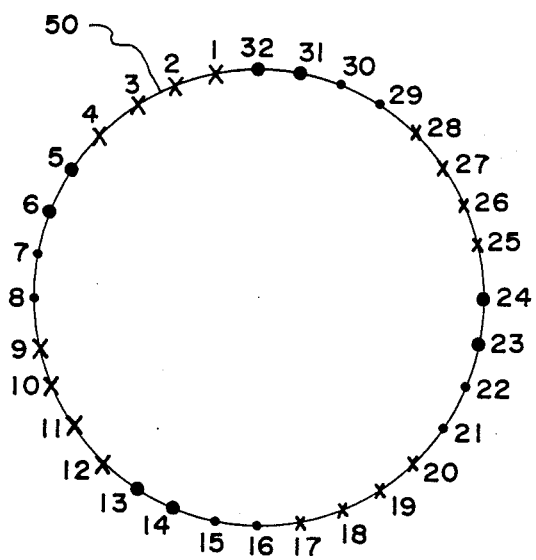
FIG. 3 is a top view of the multipole used as a quadrupole and an octupole simultaneously with each pole independent.

In FIG. 3 a combination of a quadrupole, given by poles 1-4 and 9-12 being the positive poles (shown by large X's) and poles 17-20 and 25-28 being negative (shown by small X's) is combined with an octupole with 5, 6, 13, 14, 23, 24, 31 and 32 being positive (shown by large dots) and 7, 8, 15, 16, 21, 22, 29 and 30 being negative (shown by small dots).

There is a large number of combinations of quadrupoles, sextupoles, octupoles, and other configurations possible.

As shown above the fields are additive so the poles can be set to values of any desired combination of dipoles, quadrupoles, sextupoles, octupoles, or other combinations of poles, all in the same lens. Since the currents or charges are additive the same pole may be used in an octupole and a quadrupole simultaneously as shown in FIG. 4.

Figure 4:
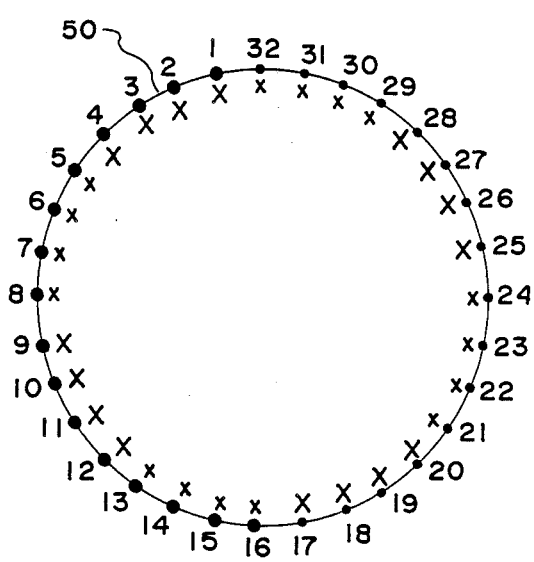
FIG. 4 is a top view of the multipole used as a quadrupole and an octupole simultaneously where some poles are used for both types of poles.

FIG. 4 shows a quadrupole with poles 1-8 and 9-16 being positive (as indicated by large dots) and poles 17-24 and 25-32 being negative (as indicated by small dots) combined with an octupole with poles 1-4, 9-12, 17-20, and 25-28 being positive (as indicated by large X's) and poles 5-8, 13-16, 21-24, and 29-32 are negative (as indicated by small X's).

It is also possible to use all 32 poles independently to focus a charged particle beam. Since the effect of each pole can be easily observed adjustments to the beam can be made for each pole until the beam is satisfactorily focused.

In charged particle optics, geometric and chromatic aberration corrections are just as important as in light optics. With light optics different wavelengths are refracted at different rates by a lens. Optics lenses also introduce geometric errors due to imperfections in the shape of the lens.

With charged particle beams particles with different energies are bent by the magnetic or electric fields at different rates creating a chromatic-type aberration. Geometric type aberrations are created by the fields imperfections.

In the past, two or more magnetic or electrostatic lenses have been used in series to focus charged particle beams. The second or subsequent lenses attempt to make corrections to the beam not accomplished in the first lens. Attempts to re-focus the beam downstream tend not to work well due to the divergence of the beam and because aberrations in the first lens will get worse in lenses downstream.

In the prior art some devices use a quadrupole and an octupole downstream. Other devices use other combinations of poles one after the other.

The present invention with its multiplicity of poles can be used as a quadrupole and an octupole or any other combination of poles simultaneously. Therefore the charged particle beam will experience markedly reduced aberrations and divergence errors which have to be corrected in a second lens downstream.

Figure 10:
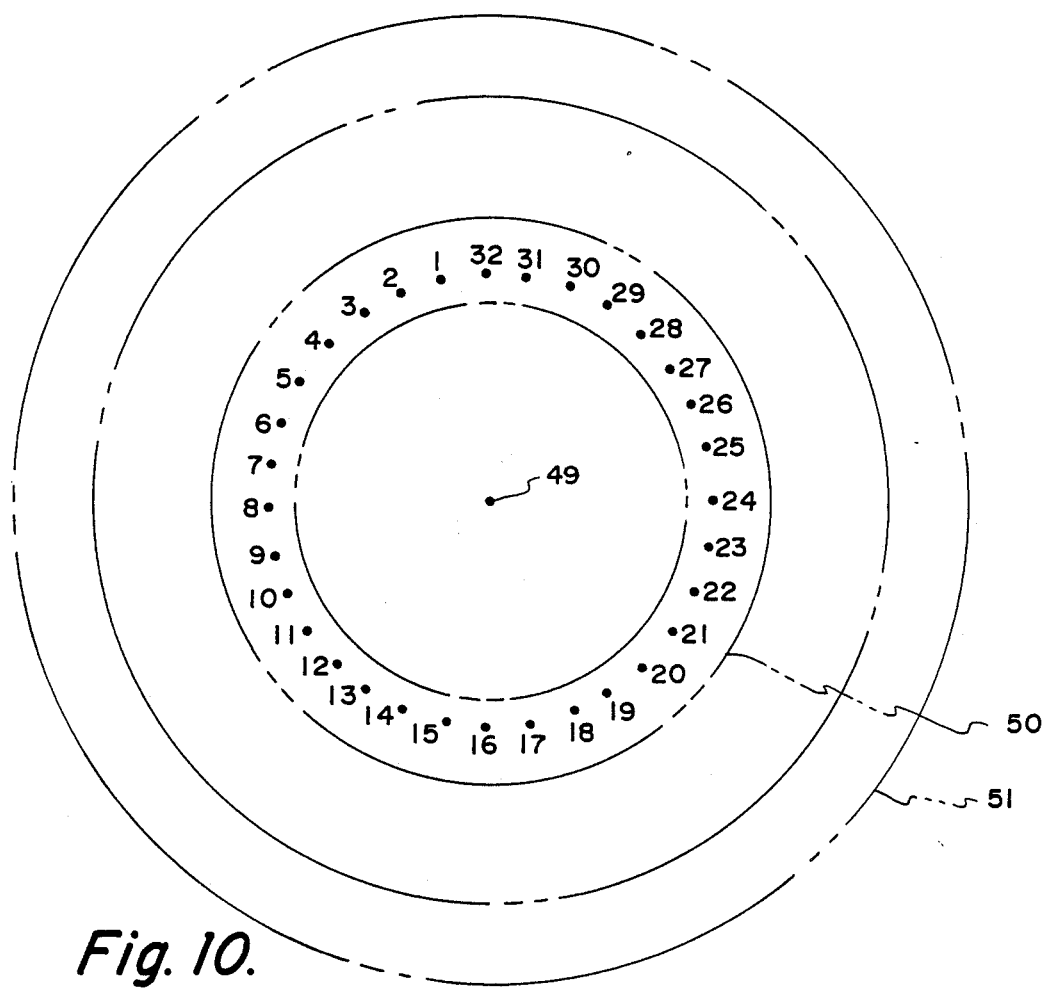
FIG. 10 is an end view of the fine focus lens positioned inside a coarse focus lens.
Figure 11:
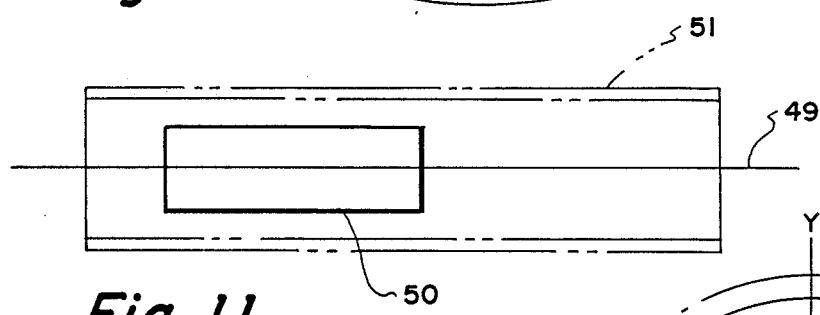
FIG. 11 is a cutaway side view of the fine focus lens positioned inside a coarse focus lens.

As shown in FIGS. 10 and 11 it is preferable to use the additive properties of electric and magnetic field as shown above by placing the fine focusing lens 50 within a larger coarse focusing lens 51 to make fine tuning of the larger lens possible. As an example the fine focusing lens 51 may be placed inside a quadrupole made with permanent magnets as the coarse focusing lens 51.

The lens 50 can correct for geometric or chromatic errors which would otherwise emanate from lens 51 to finely focus the charged particle beam 49.

What is claimed and desired to be secured by Letters Patent of the United States is:

1. A magnetic optics adaptive technique for focusing charged particle beams comprising
   a lens having a circumference and a length and having a plurality of poles, evenly spaced, around the circumference of the lens,
   a means of controlling the intensity of the field lines in each pole separately,
   a means of tagging each pole so the effects of each pole may be separately detected in a charged particle beam.

2. A magnetic optics adaptive technique for focusing charged particle beams as in claim 1 where
   the poles are electromagnetic poles.

3. A magnetic optics adaptive technique for focusing charged particle beams as in claim 2 where
   the means of tagging each pole is by an identifying frequency being induced on the charged particle beam.

4. A magnetic optics adaptive technique for focusing charged particle beams as in claim 2 where
   the means of tagging each pole is by an identifying phase being induced on the charged particle beam.

5. A magnetic optics adaptive technique for focusing charged particle beams as in claim 2 where
   the means of tagging each pole is by an identifying pulse being induced on the charged particle beam.

6. A magnetic optics adaptive technique for focusing charged particle beams as in claim 2 where
   the electromagnetic poles are wires with a current passing through them,
   the current in the wires is between zero and three amps of direct current,
   the tagging current is a sinusoidal current of between 100 kilohertz and one megahertz,
   the tagging current is between tenths of amps and milliamps.

7. A magnetic optics adaptive technique for focusing charged particle beams as in claim 1 where
   the poles are electrostatic poles.

8. A magnetic optics adaptive technique for focusing charged particle beams as in claim 7 where
   the means of tagging each pole is by an identifying frequency being induced on the charged particle beam.

9. A magnetic optics adaptive technique for focusing charged particle beams as in claim 7 where
   the means of tagging each pole is by an identifying phase being induced on the charged particle beam.

10. A magnetic optics adaptive technique for focusing charged particle beams as in claim 7 where
    the means of tagging each pole is by an identifying pulse being induced on the charged particle beam.

11. A magnetic optics adaptive technique for focusing charged particle beams as in claim 7 where the electrostatic poles have a surface which is curved to the circumference of the lens.

12. A magnetic optics adaptive technique for focusing charged particle beams as in claim 7 where
    a potential on each pole can be varied between several hundred electron volts and several thousand electron volts,
    a tagging charge is varied between one volt and tens of volts,
    a frequency used as the tagging signal is between ten kilohertz and one megahertz.

13. A magnetic optics adaptive technique for focusing charged particle beams comprising
    a lens having a circumference and a length and having a plurality of poles, evenly spaced, around the circumference of the lens, each pole extending the length of the lens,
    a means of controlling the intensity of the field lines in each pole separately,
    a means of tagging each pole so the effects of each pole may be separately detected in a charged particle beam,
    a means of detecting the tagged charged particle beam,
    a means for adjusting the intensity of the poles until the charged particle beam is satisfactorily focused,
    where each pole is an electromagnetic pole.

14. A magnetic optics adaptive technique for focusing charged particle beams as in claim 13 where
    the means of tagging each pole is by an identifying frequency being induced on the charged particle beam.

15. A magnetic optics adaptive technique for focusing charged particle beams as in claim 13 where
    the means of tagging each pole is by an identifying phase being induced on the charged particle beam.

16. A magnetic optics adaptive technique for focusing charged particle beams as in claim 13 where
    the means of tagging each pole is by an identifying pulse being induced on the charged particle beam.

17. A magnetic optics adaptive technique for focusing charged particle beams comprising
    a lens having a circumference and a length and having a plurality of poles, evenly spaced, around the circumference of the lens, each pole extending the length of the lens,
    a means of controlling the intensity of the field lines in each pole separately,
    a means of tagging each pole so the effects of each pole may be separately detected in a charged particle beam,
    a means of detecting the tagged charged particle beam,
    a means for adjusting the intensity of the poles until the charged particle beam is satisfactorily focused,
    where each pole is an electrostatic pole having a surface which is curved to the circumference of the lens.

18. A magnetic optics adaptive technique for focusing charged particle beams as in claim 17 where
    the means of tagging each pole is by an identifying frequency being induced on the charged particle beam.

19. A magnetic optics adaptive technique for focusing charged particle beams as in claim 17 where
    the means of tagging each pole is by an identifying phase being induced on the charged particle beam.

20. A magnetic optics adaptive technique for focusing charged particle beams as in claim 17 where
    the means of tagging each pole is by an identifying pulse being induced on the charged particle beam.

* * * * *